(12) United States Patent
Evans et al.

(10) Patent No.: US 9,324,900 B2
(45) Date of Patent: Apr. 26, 2016

(54) METHOD OF FABRICATING A SUPERLATTICE STRUCTURE

(71) Applicant: TELEDYNE SCIENTIFIC & IMAGING, LLC, Thousand Oaks, CA (US)

(72) Inventors: Allan Evans, Woodland Hills, CA (US); William Tennant, Thousand Oaks, CA (US); Andrew Hood, Ventura, CA (US)

(73) Assignee: TELEDYNE SCIENTIFIC & IMAGING, LLC, Thousand Oaks, CA (US)

( * ) Notice: Subject to any disclaimer, the term of this patent is extended or adjusted under 35 U.S.C. 154(b) by 0 days.

(21) Appl. No.: 13/957,266

(22) Filed: Aug. 1, 2013

(65) Prior Publication Data
US 2015/0037925 A1    Feb. 5, 2015

(51) Int. Cl.
  *H01L 21/00* (2006.01)
  *H01L 31/18* (2006.01)
  *H01L 21/02* (2006.01)

(52) U.S. Cl.
  CPC ...... *H01L 31/1844* (2013.01); *H01L 21/02463* (2013.01); *H01L 21/02466* (2013.01); *H01L 21/02507* (2013.01); *H01L 21/02546* (2013.01); *H01L 21/02549* (2013.01)

(58) Field of Classification Search
  CPC ................................................. H01L 21/02538
  USPC ........................................................... 438/94
  See application file for complete search history.

(56) References Cited

U.S. PATENT DOCUMENTS

| | | | |
|---|---|---|---|
| 6,054,706 A * | 4/2000 | Razeghi ............... | 250/214.1 |
| 6,407,407 B1 | 6/2002 | Johnson et al. ........... | 257/18 |
| 7,682,865 B2 | 3/2010 | Razeghi ................... | 438/93 |
| 7,692,183 B2 | 4/2010 | Razeghi ...................... | 257/28 |
| 2002/0140012 A1 * | 10/2002 | Droopad .................. | 257/295 |
| 2010/0155777 A1 * | 6/2010 | Hill et al. .................. | 257/184 |
| 2010/0230720 A1 | 9/2010 | Wicks ....................... | 257/188 |
| 2011/0095334 A1 * | 4/2011 | Scott ......................... | 257/188 |
| 2011/0204212 A1 * | 8/2011 | Feng et al. ............. | 250/208.2 |
| 2011/0254471 A1 * | 10/2011 | Bahir et al. ............... | 315/363 |
| 2013/0203243 A1 * | 8/2013 | Liu et al. ......... | H01L 21/2538 438/478 |

OTHER PUBLICATIONS

A. J. Evans et al., Strained Layer Superlattice (SLS) Materials for High Operating Temperature MWIR Detectors, Feb. 2011, pp. 1-14.
C. Grein et al., "Optimization of MWIR Type-II Superlattices for Infrared Detection". *Proc. SPIE* 7660, Infrared Technology and Applications XXXVI. 76601L (May 3, 2010), pp. 1-5.
A. J. Evans et al., MWIR Strained Layer Superlattice (SLS) Detector Materials for Persistent Surveillance, Feb. 2010, pp. 1-14.

* cited by examiner

*Primary Examiner* — Matthew Landau
*Assistant Examiner* — Igwe U Anya
(74) *Attorney, Agent, or Firm* — Koppel, Patrick, Heybl & Philpott

(57) ABSTRACT

A method of fabricating a superlattice structure requires that atoms of a first III-V semiconductor compound be introduced into a vacuum chamber such that the atoms are deposited uniformly on a substrate. Atoms of at least one additional III-V compound are also introduced such that the atoms of the two III-V compounds form a repeating superlattice structure of alternating thin layers. Atoms of a surfactant are also introduced into the vacuum chamber while the III-V semiconductor compounds are being introduced, or immediately thereafter, such that the surfactant atoms act to improve the quality of the resulting SL structure. The surfactant is preferably bismuth, and the III-V semiconductor compounds are preferably GaSb along with either InAs or InAsSb; atoms of each material are preferably introduced using molecular beam epitaxy. The resulting superlattice structure is suitably used to form at least a portion of an IR photodetector.

12 Claims, 2 Drawing Sheets

☒ INDIUM/GALLIUM
☐ ARSENIC/ANTIMONY
▨ BISMUTH

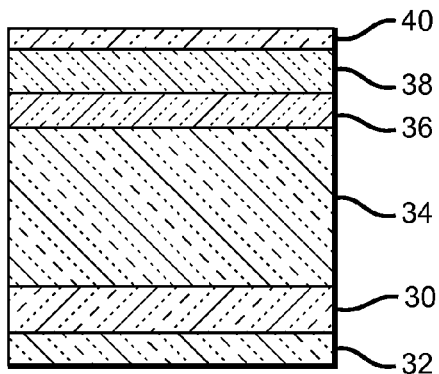
*FIG. 3a*
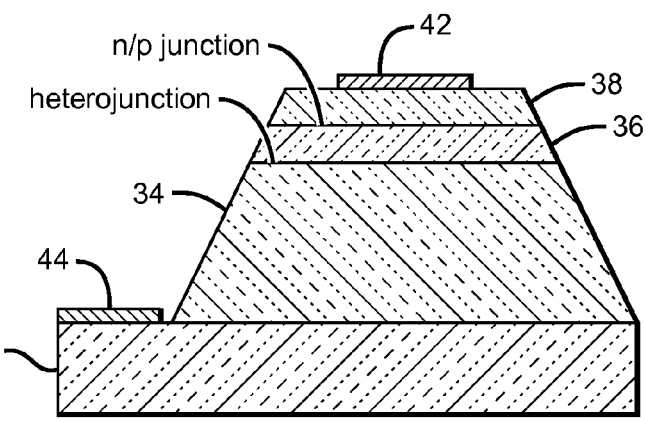
*FIG. 3b*
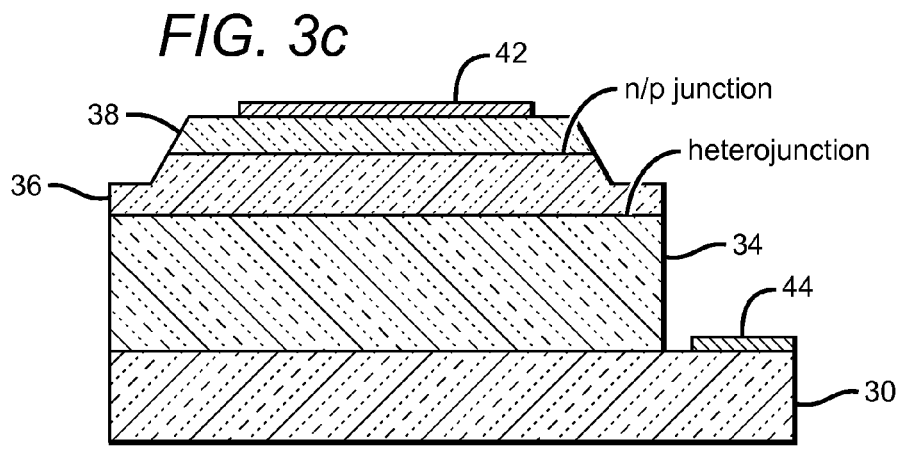

METHOD OF FABRICATING A SUPERLATTICE STRUCTURE

GOVERNMENT RIGHTS

This invention was made with Government support under U.S. Govt. Contract No. 10-C-0136. The Government has certain rights in this invention.

FIELD OF THE INVENTION

This invention is directed to compound semiconductors, and more particularly to methods of fabricating superlattice structures.

BACKGROUND

Infrared (IR) photodetectors have found widespread application in IR thermal imaging systems. Traditionally, the most sensitive IR detectors have been made with mercury-cadmium-telluride (HgCdTe) alloy. However, HgCdTe materials have been refined to the point where they are extremely pure and device performance is now limited by the fundamental properties of the electronic band structure of the HgCdTe crystal, which cannot be improved further. Furthermore, the size of cadmium-zinc-telluride (CdZnTe) substrates, on which the HgCdTe is grown, has been outpaced by other substrate materials, such as GaAs, InP, GaSb, and silicon, which are available in larger sizes. The current CdZnTe substrate size limits the number of HgCdTe infrared detector devices which can be fabricated on a single wafer, which in turn prevents HgCdTe-based infrared detectors from benefitting from the economy of scale seen with larger substrates that can accommodate more devices. Additionally, the wafer size limits the ultimate size of large arrays, which would consume an entire wafer. In the very long IR wavelengths, HgCdTe-based detectors have exhibited problems with (i) compositional variations across the wafer which cause variations of the band gap, (ii) large tunneling dark currents caused by the narrow band gap (<0.1 eV), and (iii) higher defect-related dark currents.

The emergence of thin film growth techniques such as molecular beam epitaxy (MBE) and metal organic chemical vapor deposition (MOCVD) has allowed the synthesization of a wide range of multiple quantum well (MQW) and superlattice (SL) engineered materials. Such artificial structures are currently of great interest as they afford the possibility of tailoring the electronic structure of the crystal by controlled modification of the crystal: viz., layer thickness, alloy composition, strain, growth orientation, etc. Of particular note, the growth of thin strained layer superlattices (SLSs) using Group III-V materials has opened up new materials for IR detection which can be engineered to be superior to other state-of-the-art materials. Detectors based on such SLSs can be readily manufactured at lower costs compared to HgCdTe, with the same or better performance, owing to their compatibility with advanced III-V device processing technology currently in place to support the diode laser and transistor industries—a commonality and economy-of-scale II-VI-based HgCdTe do not benefit from.

One common SLS detector configuration makes use of binary/binary InAs/GaAs materials. These detectors are known to suffer from an as-yet unidentified defect that reduces carrier lifetime, causes recombination of light-generated carriers before they can be collected and measured at a terminal of the device, and produces excess dark current.

A technique described in W. Shaffer, "IR&D Report on MBE of Bi-containing III-V compounds", Rockwell Science Center (1982) employed bismuth overpressure with various III-V compounds to achieve reduced background carrier concentration. However, this was not practiced in the context of a superlattice structure.

SUMMARY OF THE INVENTION

A method of fabricating a superlattice structure comprised of III-V semiconductor materials is presented which overcomes the problems discussed above.

The present superlattice fabrication method requires that atoms of a first III-V semiconductor be introduced into a vacuum chamber such that the atoms are deposited uniformly on a substrate. Atoms of at least one additional III-V semiconductor compound are also introduced into the vacuum chamber such that the atoms of the two III-V semiconductor compounds form a repeating superlattice (SL) structure of very thin layers. The method also includes introducing atoms of a surfactant into the vacuum chamber while the atoms of the III-V semiconductor compounds are being introduced, or immediately thereafter, such that the surfactant atoms act to improve the quality of the resulting SL structure.

The surfactant is preferably bismuth, and the III-V semiconductor compounds are preferably GaSb along with either InAs or InAsSb; atoms of each material are preferably introduced into the vacuum chamber using molecular beam epitaxy (MBE). When the III-V compounds are GaSb and InAs, the structure may also include a partial-monolayer layer of InSb between the GaSb and InAs layers. The atoms of the III-V semiconductor compounds and of the surfactant are preferably introduced such that the surfactant atoms do not become part of the superlattice structure. The resulting superlattice structure is suitably used to form at least a portion of an IR photodetector.

These and other features, aspects, and advantages of the present invention will become better understood with reference to the following description and claims.

BRIEF DESCRIPTION OF THE DRAWINGS

FIG. 3a is a sectional view of one possible embodiment of an IR photodetector which might employ the present SL structure.

FIG. 3b is a sectional view of another possible embodiment of an IR photodetector which might employ the present SL structure.

FIG. 3c is a sectional view of another possible embodiment of an IR photodetector which might employ the present SL structure.

DETAILED DESCRIPTION OF THE INVENTION

Figure 1:
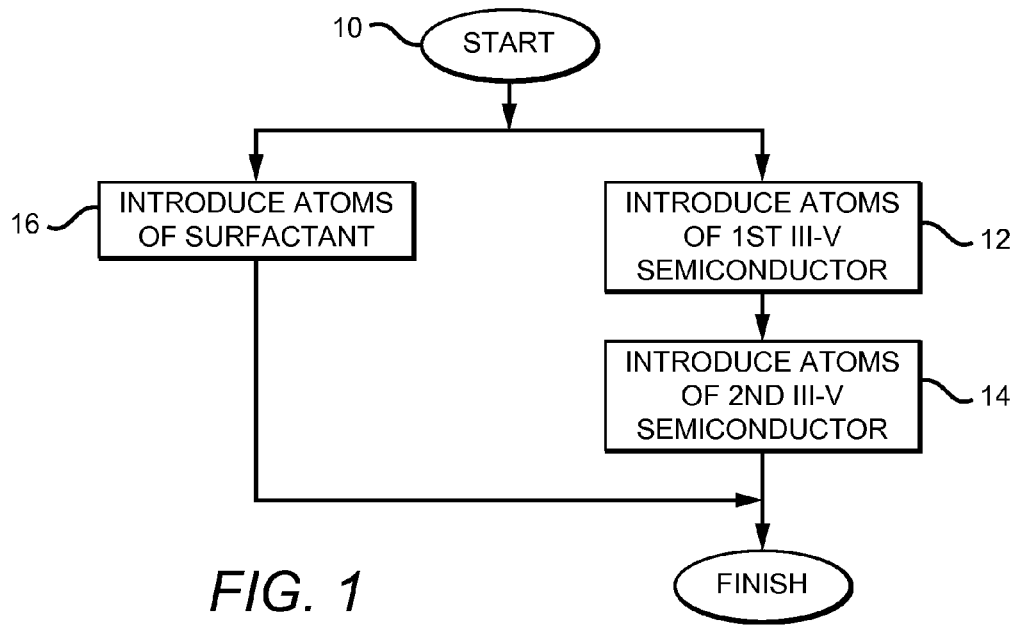
FIG. 1 is a flow diagram illustrating the steps of the present method.

The present method of fabricating a SL structure is suitably employed to form a part of an IR detector, though other applications might include, for example, superlattice-based photodetectors, SL semiconductor lasers, thermoelectric power generators, or thermoelectric coolers. The method 10 is illustrated in FIG. 1.

In accordance with the present method, to grow a superlattice structure comprised of III-V semiconductor materials, the atoms of a first III-V semiconductor compound are introduced into a vacuum chamber such that the atoms are deposited uniformly on a substrate (step 12). This is followed by introducing atoms of at least one additional III-V semiconductor compound into the vacuum chamber (14), such that the atoms of the III-V semiconductor compounds form a SL structure. In a further step, while the atoms of the III-V semiconductor compounds are being introduced, or immediately thereafter, atoms of a surfactant are also introduced into the vacuum chamber (16), such that the surfactant atoms act to improve the quality of the resulting superlattice structure. The atoms of the III-V semiconductor compounds and the surfactant are preferably introduced using molecular beam epitaxy (MBE). By repeating these steps as needed, a repeating SL structure of very thin layers is formed.

Use of a surfactant in this way serves to improve carrier mobility and reduce background free carrier concentration in the SL structure, which generally indicates that the crystal structure is well-ordered. This may occur because the surfactant improves the surface mobility of adatoms, so that they more easily find the lowest energy states and therefore form a cohesive high-quality crystal structure. The introduction of the III-V and surfactant atoms is preferably arranged such that the surfactant atoms are not incorporated into the crystal and thus do not become part of the SL structure, but rather ride on the surface of the structure as it grows and act as a diffusion/barrier layer which assists in crystal formation.

The III-V semiconductor compounds are preferably introduced sequentially. However, the surfactant atoms are preferably introduced continuously, throughout the introduction of the III-V semiconductor compounds. This is to ensure that there are always surfactant atoms present on the surface of the growing SL structure, as the surfactant atoms do not bond atomically with the III-V semiconductor compounds.

The III-V semiconductor compounds may be, for example, InAs and GaSb, InAsSb and InAs, or InAsSb and GaSb. When the III-V semiconductor compounds are InAs and GaSb, the SL structure might also include a partial-monolayer layer of InSb between the InAs and GaSb layers. The surfactant is preferably bismuth, though other materials might also be used.

Figure 2:
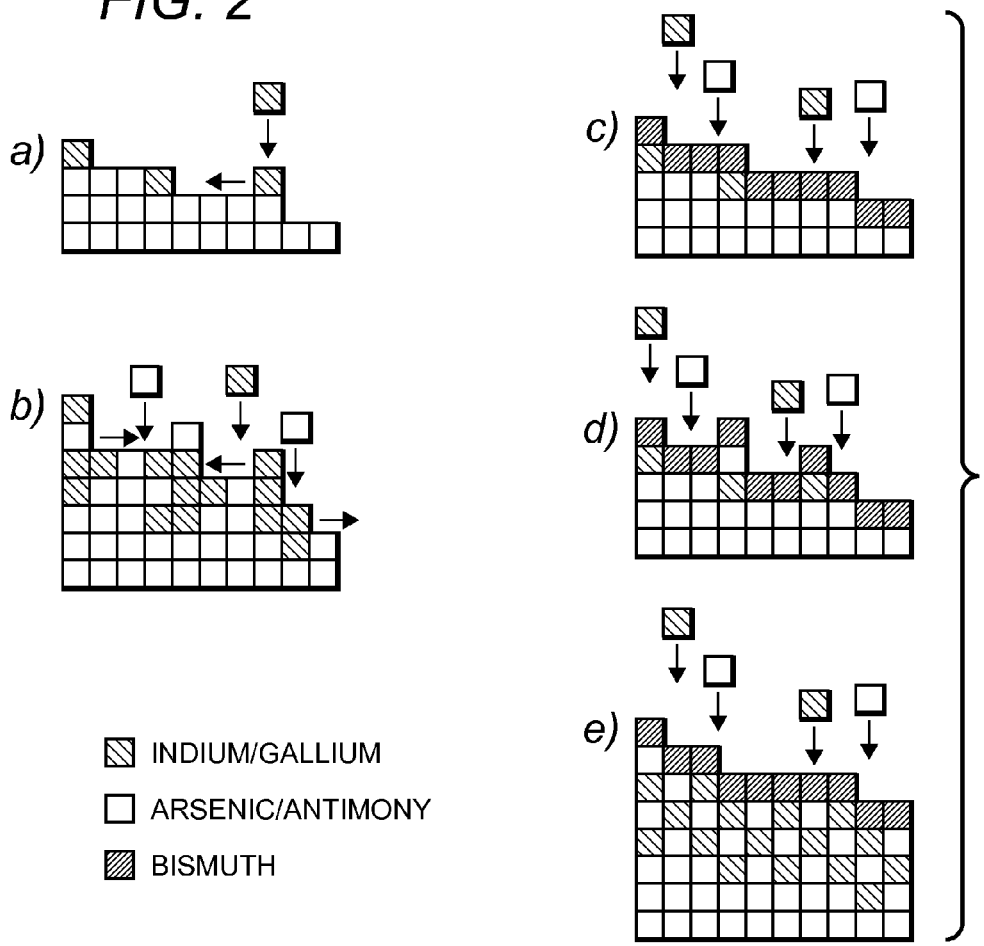
FIG. 2 is a diagram illustrating the fabrication of a SL structure per the present method.

An illustration of the fabrication of an exemplary SL structure with and without the present method is shown in FIG. 2, which is a simplified 2D view of a slice of a 3D crystal. In a) and b), atoms of indium or gallium and arsenic or antimony are introduced, resulting in a poorly-ordered binary semiconductor crystal structure. However, in c), d) and e), atoms of bismuth are introduced. As noted above, the bismuth acts as a surfactant or catalyst during MBE growth, resulting in a well-ordered crystal structure. Note that both species, such as In and As, would not occupy the same plane in an ideal crystal, but might if there was a defect. A compound such as InAs is formed when In atoms bond with As on the surface. If the flux ratios of atoms impinging on the surface are not correct, or the reaction temperature is not ideal, the compounds will not form correctly. The surfactant acts to provide a larger tolerance window for compound formation, thereby helping the compounds to form properly. There might be just a single introduction of surfactant atoms; alternatively, atoms of, for example, bismuth, could be introduced via bismuth overpressure.

Note that a practical device structure would typically be made from pairs of III-V compound layers, with the pairs repeated multiple times. As noted above, the SL structure is preferably formed using MBE, but could be formed using other semiconductor growth techniques such as Metal-Organic Vapor Phase Epitaxy (MOVPE), or Chemical Vapor Deposition (CVD). Here, atoms of a layer's materials are introduced onto a crystal surface and bond with other atoms to form a first crystal layer. A second layer is formed on the first layer using the same MBE process, but with different materials. Each layer is typically several atoms thick and additional first and second layers are stacked atop the first two layers to grow the SL structure. This method of forming a semiconductor structure is particularly advantageous when fabricating photodetectors. Building the layers atom-by-atom enables the relationship between device materials and the resulting crystal properties which control band gap, absorption coefficient, electrical mobility, and carrier lifetime to be well-understood and predictable. As such, the performance characteristics of a detector can be more easily engineered and manufactured.

The layers might be arranged such that a pair consists of a first III-V semiconductor layer (such as InAs) below a second III-V semiconductor layer (such as GaSb), or alternatively such that a GaSb layer is below a InAs layer. The same holds true for other possible material combinations: for example, the first layer might be InAsSb and the second InAs, or vice versa. Similarly, the first layer might be InAsSb and the second GaSb, or vice versa. Such SL structures have numerous applications; one possible application for a SL structure as described herein is as a portion of a photodetector, suitably IR, including Type-II SLS, InGaAs and InAs photodetectors. Detectors employing SL structures formed as described herein may be Auger limited, with dark current densities potentially below those achievable by detectors made from HgCdTe materials. Other possible applications include III-V electronic components, lasers and LEDs, and other types of III-V based optoelectronics.

The present SL structure is suitably employed as a portion of an IR photodetector. One possible embodiment is shown in FIG. 3a, which depicts a double heterostructure, with an MWIR Absorber—i.e., an absorber layer with a MWIR bandgap—capped by wider bandgap cap layers. In the exemplary embodiment shown, a P-type SL electrical contact 30 is on a GaSb buffer substrate layer 32, and an SL Absorber layer 34 formed as described herein is on contact 30. A P-type SL contact 36, an N-type SL electrical contact 38 and a cap layer 40 on SL Absorber layer 34 complete the device. A heterostructure is formed where two different superlattices meet. Thus, in FIG. 3a, a 'top' heterostructure is formed between SL Absorber layer 34 and wider bandgap layer (and P-type SL contact) 36, and a 'bottom' heterostructure is formed between layer 34 and wider bandgap layer (and P-type SL electrical contact) 30. Due to its distance from the high electric field region that forms around the nip junction between layers 36 and 38, the bottom heterostructure is not as critical to device operation as the top one. However, the bottom heterostructure should still be carefully engineered, because an incorrectly engineered bottom heterostructure can lead to reduced quantum efficiency and unintended carrier recombination.

Processed device embodiments with deep- and shallow-etched mesas, which serve to isolate the individual pixels, are shown in FIGS. 3b and 3c, respectively. These device figures include contacts 42 and 44, which contact cap layer 40 (not labeled in FIGS. 2b and 2c) and layer 30 (within the processed device architecture), respectively.

The heterojunctions where two superlattices meet are preferably graded; i.e. arranged such that there is a gradual transition of bandgap from one superlattice to another. For example, the bandgap of layer 34 is different than the bandgap of the other layers in FIG. 3a; i.e., it is smaller than the bandgaps of layers 36 and 30. To facilitate transport of carriers across the nip junction, the bandgap of layer 34 can be graded—i.e., slowly transitioning from small to large over the last ~0.5 to 1 micron of layer 34—until it equals the bandgap of layer 36. This may be implemented by, for example, changing the period and composition of the superlattice in layer 34 until it equals the superlattice in layer 36.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A method of fabricating a superlattice structure comprised of III-V semiconductor materials, comprising:
    introducing atoms of a first III-V semiconductor compound into a vacuum chamber such that said atoms are deposited uniformly on a substrate;
    introducing atoms of at least one additional III-V semiconductor compound into said vacuum chamber such that the atoms of said III-V semiconductor compounds form a superlattice structure; and
    introducing atoms of a surfactant into said vacuum chamber while said atoms of said III-V semiconductor compounds are being introduced or immediately thereafter, such that said surfactant atoms act to improve the quality of the resulting superlattice structure;
    wherein the atoms of said III-V semiconductor compounds and of said surfactant are introduced such that said surfactant atoms do not become part of said superlattice structure.

2. The method of claim 1, wherein said surfactant is bismuth.

3. The method of claim 1, wherein the atoms of said III-V semiconductor compounds and of said surfactant are introduced using molecular beam epitaxy (MBE), metal-organic vapor phase epitaxy (MOVPE), or chemical vapor deposition (CVD).

4. The method of claim 1, wherein said III-V semiconductor compounds are InAsSb and InAs.

5. The method of claim 1, wherein said superlattice structure forms at least a portion of an infrared photodetector.

6. The method of claim 1, wherein the introduction of said first III-V semiconductor compound forms a first layer and the introduction of said at least one additional III-V semiconductor compound forms a second layer, said first and second layers repeating to form said superlattice structure.

7. The method of claim 1, wherein said superlattice structure is arranged to operate as an absorber layer.

8. The method of claim 7, wherein said absorber layer has a MWIR bandgap.

9. A method of forming a superlattice structure for use in an infrared photodetector, comprising:
    introducing atoms of InAs into a vacuum chamber via molecular beam epitaxy (MBE) such that said InAs atoms are deposited uniformly on a substrate;
    introducing atoms of InAsSb into said vacuum chamber via MBE such that said InAs and InAsSb atoms form a superlattice structure that comprises at least a portion of an infrared photodetector; and
    exposing said InAs and InAsSb compounds with bismuth atoms via MBE such that said bismuth atoms act to improve the quality of the resulting superlattice structure;
    wherein said exposing of said compounds via MBE occurs as said InAs and InAsSb compounds are introduced or immediately thereafter, such that said bismuth atoms act to improve the quality of the resulting superlattice structure without said bismuth atoms becoming part of said superlattice structure.

10. A method of forming a superlattice structure for use in an infrared photodetector, comprising:
    introducing atoms of InAsSb into a vacuum chamber via molecular beam epitaxy (MBE) such that said InAsSb atoms are deposited uniformly on a substrate;
    introducing atoms of InAs into said vacuum chamber via MBE such that said InAs and InAsSb atoms form a superlattice structure that comprises at least a portion of an infrared photodetector; and
    exposing said InAs and InAsSb compounds with bismuth atoms via MBE such that said bismuth atoms act to improve the quality of the resulting superlattice structure;
    wherein said exposing of said compounds via MBE occurs before, and/or as said InAs and InAsSb compounds are introduced or immediately thereafter, such that said bismuth atoms act to improve the quality of the resulting superlattice structure without said bismuth atoms becoming part of said superlattice structure.

11. A method of fabricating a superlattice structure comprised of III-V semiconductor materials, comprising:
    introducing atoms of a first III-V semiconductor compound into a vacuum chamber such that said atoms are deposited uniformly on a substrate;
    introducing atoms of at least one additional III-V semiconductor compound into said vacuum chamber such that the atoms of said III-V semiconductor compounds form a superlattice structure;
    introducing atoms of a surfactant into said vacuum chamber while said atoms of said III-V semiconductor compounds are being introduced or immediately thereafter, such that said surfactant atoms act to improve the quality of the resulting superlattice structure, wherein said superlattice structure is arranged to operate as an absorber layer; and
    fabricating first and second layers which cap said absorber layer, each of said first and second layers having a wider bandgap than that of said absorber layer such that a heterostructure is formed between each of said first and second layers and said absorber layer.

12. The method of claim 11, wherein the bandgap of said absorber layer is graded is the region between the absorber layer and each of said first and second layers.

* * * * *